(12) United States Patent
Park et al.

(10) Patent No.: US 7,941,736 B2
(45) Date of Patent: May 10, 2011

(54) APPARATUS AND METHOD FOR RECEIVING SIGNAL IN COMMUNICATION SYSTEM

(75) Inventors: Sung-Eun Park, Seoul (KR); Chi-Woo Lim, Suwon-si (KR); Thierry Lestable, Staines (GB); Dong-Seek Park, Yongin-si (KR); Jae-Yoel Kim, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 1113 days.

(21) Appl. No.: 11/709,922

(22) Filed: Feb. 22, 2007

(65) Prior Publication Data

US 2007/0226585 A1 Sep. 27, 2007

(30) Foreign Application Priority Data

Feb. 22, 2006 (KR) .................. 10-2006-0017363

(51) Int. Cl.
*G06F 11/00* (2006.01)
(52) U.S. Cl. ........................................ 714/800
(58) Field of Classification Search .......... 714/800–801, 714/807
See application file for complete search history.

(56) References Cited

FOREIGN PATENT DOCUMENTS

| KR | 1020030062273 | 7/2003 |
|----|---------------|--------|
| WO | WO 2005/020500 | 3/2005 |
| WO | WO 2005/062472 | 7/2005 |

OTHER PUBLICATIONS

Boutros et al., non-binary adaptive LDPC codes for frequency selective channels: code construction and iterative decoding, 2006, IEEE, Proceedings Info. Theory Workshop, p. 184-186.*
Ma et al., Performance advantages of non-binary LDPC codes at high code rate under AWGN channel, 2004, IEEE, p. 1-4.*
Barnault et al., Fast Decoding Algorithm for LDPC Over GF, Apr. 4, 2003.
Song et al., Reduced-Complexity Decoding of Q-ARY LDPC Codes for Magnetic Recording, IEEE Transactions on Magnetics, vol. 39, No. 2, Mar. 2003.
Voicila et al., Algorithmes Simplifies Pour Le Decodage De Codes LDPC Non-Binaires, Sep. 6, 2005.
Declercq et al., Extended Minsum Algorithm for Decoding LDPC Codes Over GF(q), Sep. 9, 2005.
Lin et al., Error Control Coding Fundamentals and Applications, 2004.
Bossert, Kanalcodierung, pp. 44-47, 1998.
Davey et al., Low Density Parity Check Codes Over GF(q), IEEE Communications Letters, vol. 2, No. 6, Jun. 1998.

* cited by examiner

*Primary Examiner* — Shelly A Chase
(74) *Attorney, Agent, or Firm* — The Farrell Law Firm, P.C.

(57) ABSTRACT

Disclosed is an apparatus for receiving a signal in a communication system, which receives the signal, and decodes the received signal in a non-binary Low Density Parity Check (LDPC) decoding scheme, in which elements of a Galois field are expressed by an exponent representation, thereby minimizing the memory capacity required for a check node operation when the non-binary LDPC code is decoded.

12 Claims, 5 Drawing Sheets

FIG.1

(PRIOR ART)

APPARATUS AND METHOD FOR RECEIVING SIGNAL IN COMMUNICATION SYSTEM

PRIORITY

This application claims priority to an application filed in the Korean Industrial Property Office on Feb. 22, 2006 and assigned Serial No. 2006-017363, the contents of which are incorporated herein by reference.

BACKGROUND OF THE INVENTION

1. Field of the Invention

The present invention relates to an apparatus and a method for receiving a signal in a communication system, and more particularly to an apparatus and a method for receiving a signal in a communication system using a non-binary Low Density Parity Check (LDPC) code, which decodes the non-binary LDPC code while minimizing the memory capacity required for performing a check node operation.

2. Description of the Related Art

Next-generation communication systems have evolved from a packet service communication system for transmitting burst packet data to a plurality of Mobile Stations (MSs), with the packet service communication system being suitable for mass data transmission. Further, next-generation communication systems are considering a LDPC code, together with a turbo code, as a channel code. The LDPC code is known to have an excellent performance gain at high-speed data transmission, and advantageously enhances data transmission reliability by effectively correcting an error due to noise occurring in a transmission channel. Examples of next-generation communication systems positively considering the use of the LDPC code include the IEEE (Institute of Electrical and Electronics Engineers) 802.16e communication system, the IEEE 802.11n communication system, etc.

Reference will now be made to the structure of a signal transmission apparatus in a common communication system using a LDPC code, with reference to FIG. 1.

Figure 1:
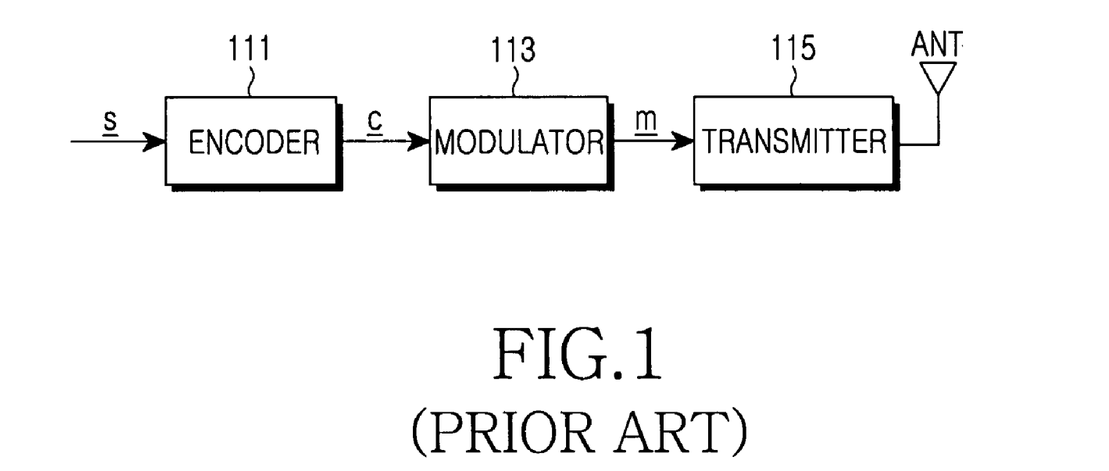
FIG. 1 is a block diagram illustrating the structure of a signal transmission apparatus in a common communication system using an LDPC code.

FIG. 1 is a block diagram illustrating the structure of a signal transmission apparatus in a common communication system using a LDPC code. Referring to FIG. 1, the signal transmission apparatus includes an encoder 111, a modulator 113 and a transmitter 115. First, if an information vector s to be transmitted occurs in the signal transmission apparatus, the information vector s is delivered to the encoder 111. The encoder 111 generates a codeword vector c, that is, a LDPC codeword by encoding the information vector s in a predetermined encoding scheme, and then outputs the generated codeword vector c to the modulator 113. Here, the predetermined encoding scheme corresponds to a LDPC encoding scheme. The modulator 113 generates a modulation vector m by modulating the codeword vector c in a predetermined modulation scheme, and then outputs the generated modulation vector m to the transmitter 115. The transmitter 115 inputs therein the modulation vector m output from the modulator 113, executes transmission signal processing for the input modulation vector m, and then transmits the processed modulation vector m to a signal reception apparatus through an antenna.

Next, reference will be made to the structure of a signal reception apparatus in a common communication system using a LDPC code, with reference to FIG. 2.

Figure 2:
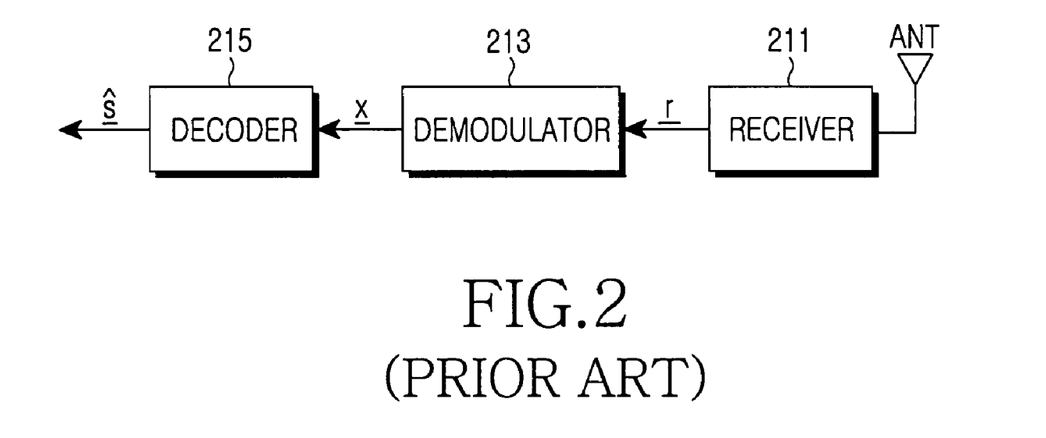
FIG. 2 is a block diagram illustrating the structure of a signal reception apparatus in a common communication system using an LDPC code.

FIG. 2 is a block diagram illustrating the structure of a signal reception apparatus in a common communication system using a LDPC code. Referring to FIG. 2, the signal reception apparatus includes a receiver 211, a demodulator 213 and a decoder 215. First, a signal transmitted by a signal transmission apparatus is received through an antenna of the signal reception apparatus, and the received signal is delivered to the receiver 211. The receiver 211 executes reception signal processing for the received signal to thereby generate a reception vector r, and then outputs the processed and generated reception vector r to the demodulator 213. The demodulator 213 inputs therein the reception vector r output from the receiver 211, generates a demodulation vector x by demodulating the input reception vector r in a demodulation scheme corresponding to a modulation scheme applied to a modulator of the signal transmission apparatus, that is, the modulator 113, and then outputs the generated demodulation vector x to the decoder 215. The decoder 215 inputs therein the demodulation vector x output from the demodulator 213, decodes the input demodulation vector x in a decoding scheme corresponding to an encoding scheme applied to an encoder of the signal transmission apparatus, that is, the encoder 111, and then outputs the decoded demodulation vector x into a finally restored information vector s. Here, the decoding scheme, that is, a LDPC scheme, is a scheme using an iterative decoding algorithm based on a sum-product algorithm. The sum-product algorithm will be described below in detail.

A binary LDPC code is a code defined by a parity check matrix in which most elements have a value of 0, but a small minority of other elements have a non-zero value, for example, a value of 1. Thus, all the elements constituting the parity check matrix of the binary LDPC code have a value of 0 or 1. In contrast with this, all elements constituting the parity check matrix of a non-binary LDPC code are elements in a Galois Field of order q (hereinafter referred to as "GF (q)"). Here, "q" in GF(q) indicates the order of a GF, and $q=2^p$. Thus, the non-binary LDPC code is a code defined by a parity check matrix in which most elements have a value of 0, but a small minority of other elements are non-zero elements, for example, elements of GF(q).

Further, a codeword of the non-binary LDPC code, C, is a vector having a length of N and including elements of GF(q), and satisfies Equation (1):

$$\sum_{i=1}^{N} h_{ji} c_i = 0, \forall j \in \{1, \cdots, M\} \tag{1}$$

In Equation (1), $h_{ji}$ denotes an element existing in a jth row and an ith column of the parity check matrix of the non-binary LDPC code, $c_i$ denotes an ith element of the codeword C, M denotes the number of rows of the parity check matrix, and N denotes the number of columns of the parity check matrix.

If it is assumed that a jth row of the parity check matrix includes three non-zero elements and the three non-zero elements are $h_{ji_1}$, $h_{ji_2}$, $h_{ji_3}$, respectively, then a codeword C satisfies Equation (2):

$$(h_{ji_1} \otimes c_{i_1}) \oplus (h_{ji_2} \otimes c_{i_2}) \oplus (h_{ji_3} \otimes c_{i_3}) = 0 \tag{2}$$

In Equation (2), $\oplus$ denotes an additive operation on GF(q), and $\otimes$ denotes a multiplicative operation on GF(q).

In general, a polynomial representation is used as a scheme for expressing elements of $GF(2^p)$. Coefficients of $GF(2^p)$ are generated from a pth degree irreducible polynomial which is defined in GF(2), and all elements of $GF(2^p)$ are expressed by a (p−1)th degree polynomial whose coefficients are defined in GF(2). $GF(2^p)$ will now be described by exemplifying $GF(2^4)$.

First, $GF(2^4)$ is generated from a fourth-order irreducible polynomial $p(x)=x^4+x+1$. Here, if it is assumed that a root of the fourth-order irreducible polynomial $p(x)=x^4+x+1$ is $\alpha$, all elements of $GF(2^4)$ are equal to $\{0, 1, \alpha, \alpha^2, \alpha^3, \ldots, \alpha^{14}\}$. Further, all the elements of $GF(2^4)$ can be expressed by at most a third-order polynomial $\alpha_3 x^3 + \alpha_2 x^2 + \alpha_1 x + \alpha_0$, the coefficients of which are defined in $GF(2)$.

All the elements $\{0, 1, \alpha, \alpha^2, \alpha^3, \ldots, \alpha^{14}\}$ of $GF(2^4)$, the polynomial coefficients $\{\alpha_3, \alpha_2, \alpha_1, \alpha_0\}$, and decimal expressions corresponding thereto are shown below in Table 1.

TABLE 1

| element | $a_3$ | $a_2$ | $a_1$ | $a_0$ | decimal number |
|---|---|---|---|---|---|
| 0 | 0 | 0 | 0 | 0 | 0 |
| 1 | 0 | 0 | 0 | 1 | 1 |
| $\alpha$ | 0 | 0 | 1 | 0 | 2 |
| $\alpha^2$ | 0 | 1 | 0 | 0 | 4 |
| $\alpha^3$ | 1 | 0 | 0 | 0 | 8 |
| $\alpha^4$ | 0 | 0 | 1 | 1 | 3 |
| $\alpha^5$ | 0 | 1 | 1 | 0 | 6 |
| $\alpha^6$ | 1 | 1 | 0 | 0 | 12 |
| $\alpha^7$ | 1 | 0 | 1 | 1 | 11 |
| $\alpha^8$ | 0 | 1 | 0 | 1 | 5 |
| $\alpha^9$ | 1 | 0 | 1 | 0 | 10 |
| $\alpha^{10}$ | 0 | 1 | 1 | 1 | 7 |
| $\alpha^{11}$ | 1 | 1 | 1 | 0 | 14 |
| $\alpha^{12}$ | 1 | 1 | 1 | 1 | 15 |
| $\alpha^{13}$ | 1 | 1 | 0 | 1 | 13 |
| $\alpha^{14}$ | 1 | 0 | 0 | 1 | 9 |

In addition, the LDPC code can be expressed using a bipartite graph which is represented by variable nodes, check nodes and edges connecting the variable nodes and the check nodes with each other.

Further, the LDPC code can be decoded on the bipartite graph by using an iterative decoding algorithm based on a sum-product algorithm. Here, the sum-product algorithm is a type of message passing algorithm, and the message passing algorithm refers to an algorithm in which messages are exchanged on the bipartite graph through the edges, and an output message is calculated and updated from messages input into the variable nodes or the check nodes. That is, since a decoder for decoding the LDPC code uses the iterative decoding algorithm based on the sum-product algorithm, it is less complex than a decoder for decoding a turbo code, and can be easily implemented as a parallel processing decoder.

In a bipartite graph of a non-binary LDPC code defined in $GF(2^p)$, a variable node is a random variable of $GF(2^p)$, and a message passed through an edge is a vector with a size of $2^p$. Each element included in the vector with a size of $2^p$ indicates the probability that the random variable has each of a $2^p$ number of elements of $GF(2^p)$.

Reference will now be made to the permutation of a message vector with the value of an edge in a non-binary LDPC code, with reference to FIG. 3.

Figure 3:
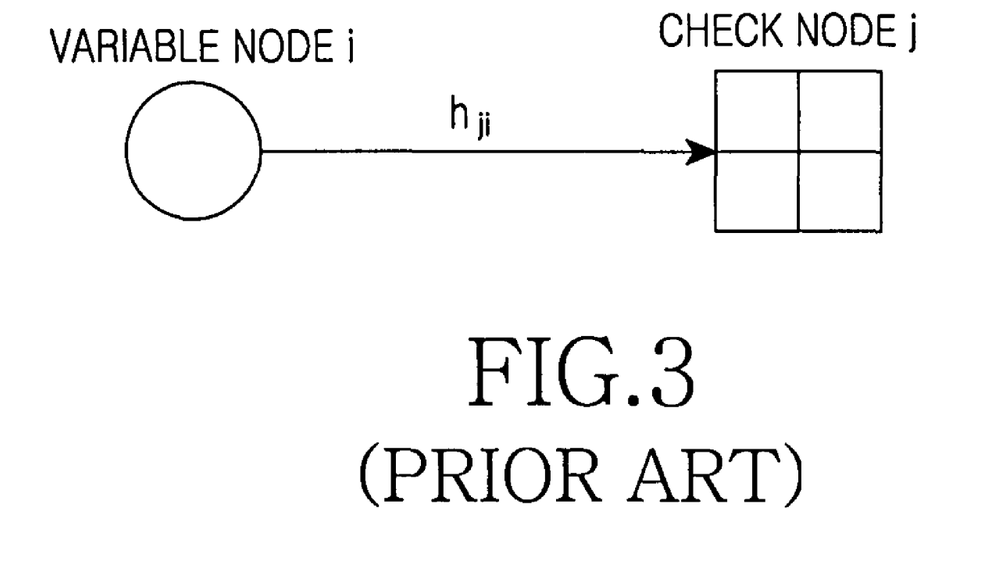
FIG. 3 explains the permutation of a message vector with the value of edge in an ordinary non-binary LDPC code.

FIG. 3 illustrates explains the permutation of a message vector with the value of edge in an ordinary non-binary LDPC code Referring to FIG. 3, variable node i and check node j are connected by an edge, and the edge connecting the variable node i and the check node j has a value of $h_{ji}$ which is an element of $GF(2^p)$. To mention that the edge connecting the variable node i and the check node j has a value of $h_{ji}$ implies that an element existing in a jth row and an ith column of a parity check matrix defined in $GF(2^p)$ is $h_{ji}$. Here, a message, which is passed through the edge connecting the variable node i and the check node j, is a vector with a size of $2^p$, and each element $\{P_0, \ldots, P_{q-1}\}$ included in the message vector with a size of $2^p$ indicates the probability that the variable node i has each element of $GF(2^p)$. The message vector is permuted with the edge's value $h_{ji}$, and elements included in the permuted message vector become $\{P_{0 \times h_{ji}}, \ldots P_{(q-1) \times h_{ji}}\}$ in sequence. Here, a multiplicative operation is defined on $GF(2^p)$, and decimal numbers $\{0, 1, \ldots, q-1\}$ indicate elements of $GF(2^p)$, expressed by the polynomial representation as shown above in Table 1.

Reference will now be made to the inner structure of a decoder in the case of decoding a non-binary LDPC code by using a sum-product algorithm, with reference to FIG. 4.

Figure 4:
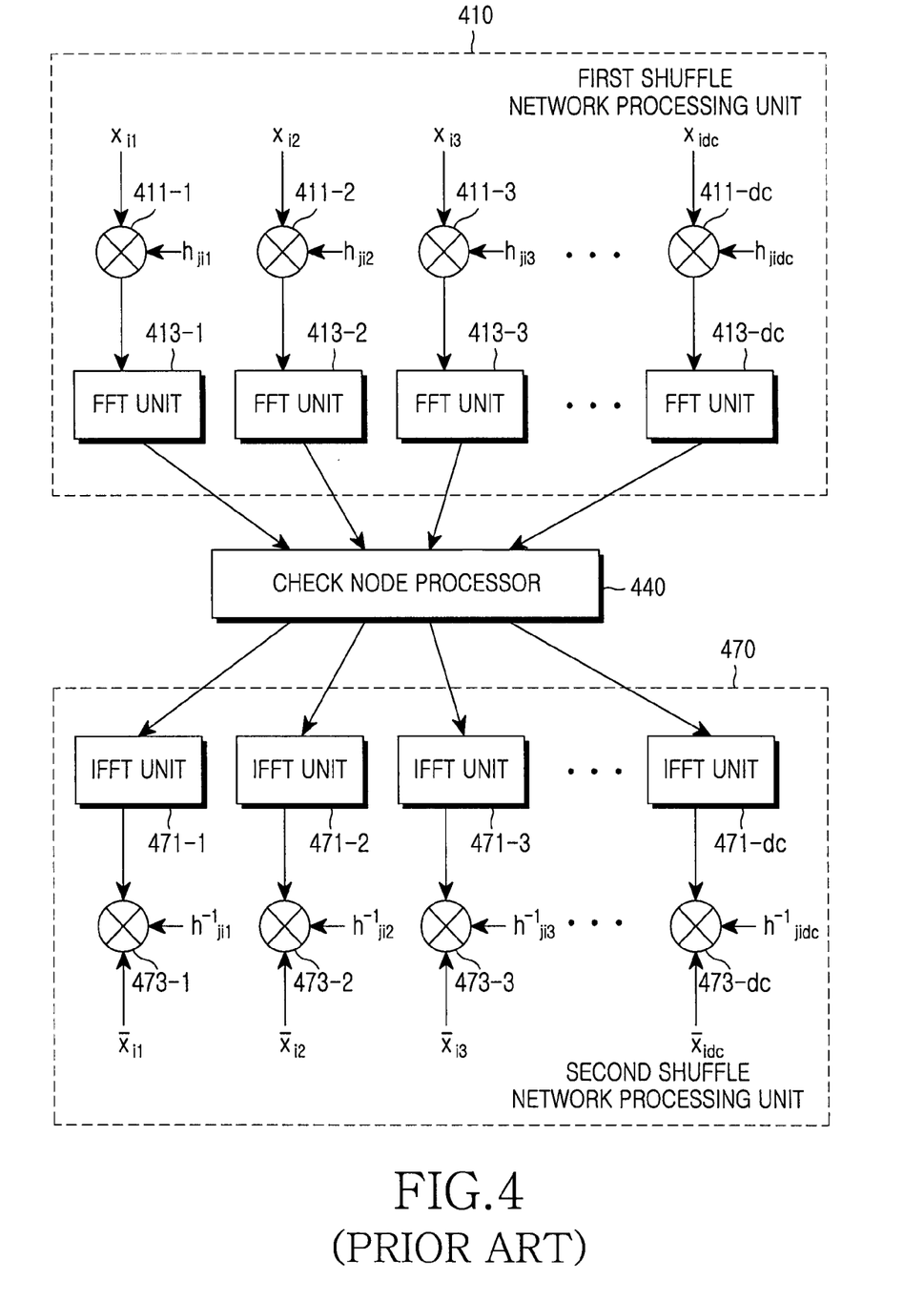
FIG. 4 is a block diagram illustrating the inner structure of a decoder for decoding an ordinary non-binary LDPC code.

FIG. 4 is a block diagram illustrating the inner structure of a decoder for decoding an ordinary non-binary LDPC code. Before explaining FIG. 4, it should be noted that although the decoder generally includes a check node processing unit and a variable node processing unit, only the structure of the check node processing unit of the decode is illustrated in FIG. 4. Referring to FIG. 4, a node processing unit within the decoder includes a first shuffle network processing unit 410, a check node processor 440 and a second shuffle network processing unit 470.

The first shuffle network processing unit 410 includes a plurality of multipliers, for example, a $d_c$ number of multipliers, that is, a multiplier 411-1 through multiplier 411-$d_c$, and a plurality of FFT (Fast Fourier Transform) units, for example, a $d_c$ number of FFT units, that is, an FFT unit 413-1 through an FFT unit 413-$d_c$.

The second shuffle network processing unit 470 includes a plurality of IFFT (Inverse Fast Fourier Transform) units, for example, a $d_c$ number of IFFT units, that is, an IFFT unit 471-1 through an IFFT unit 471-$d_c$, and a plurality of multipliers, for example, a $d_c$ number of multipliers, that is, a multiplier 473-1 through a multiplier 473-$d_c$.

The operation of the check node processing unit will now be described by exemplifying a jth check node in the parity check matrix of a non-binary LDPC code. Here, the degree of the jth check node is assumed to be $d_c$.

First, if it is assumed that input messages input into the first shuffle network processing unit 410 are $$x_{i_1}, x_{i_2}, \cdots, x_{i_{d_c}},$$

the input messages $$x_{i_1}, x_{i_2}, \cdots, x_{i_{d_c}}$$

are messages passed from a variable node to a check node, and each input message $$x_{i_1}, x_{i_2}, \cdots, x_{i_{d_c}}$$

is a vector with a size of $2^p$. The input messages $$x_{i_1}, x_{i_2}, \cdots, x_{i_{d_c}}$$

are input into the multiplier 411-1, the multiplier 411-2, the multiplier 411-3, . . . and the multiplier 411-$d_c$, respectively.

Each of multiplier 411-1 through multiplier 411-$d_c$ performs multiplication of each input message vector $$x_{i_1}, x_{i_2}, \cdots, x_{i_{d_c}}$$

and each edge value $$h_{ji_1}, h_{ji_2}, \cdots, h_{ji_{d_c}}$$

of the parity check matrix on GF($2^p$). However, since the input messages are not elements on GF($2^p$), but indicate the probabilities of having the elements on GF($2^p$), each of multiplier 411-1 through multiplier 411-d$_c$ actually performs the permutation of each input message $$x_{i_1}, x_{i_2}, \cdots, x_{i_{d_c}}.$$

Here, a $2^p \times 2^p$ number of unit memories are required for storing the permutation information. Further, since each unit memory consists of p bits, a memory capacity capable of storing total $2^p \times 2^p \times p$ bits is consequently required for storing the permutation information.

After the permutation, each of multiplier 411-1 through multiplier 411-d$_c$ outputs each permuted input message $$x_{i_1}, x_{i_2}, \cdots, x_{i_{d_c}}$$

to each of the FFT unit 413-1 through FFT unit 413-d$_c$. Each of FFT unit 413-1 through FFT unit 413-d$_c$ inputs therein a signal output from each of multiplier 411-1 through multiplier 411-d$_c$, performs FFT for the input signal, and then outputs the fast Fourier transformed signal to the check node processor 440. Here, the signal input into each of FFT unit 413-1 through and FFT unit 413-d$_c$ is the probability of each element expressed by the polynomial representation as defined above in Table 1. Further, the FFT performed in each of FFT unit 413-1 through FFT unit 413-d$_c$ means not ordinary FFT, but FFT performed on GF($2^p$), which is identical to Fast Hadamard Transform ("FHT").

The check node processor 440 inputs therein a signal output from each of FFT unit 413-1 through FFT unit 413-d$_c$, performs a check node operation, and then outputs a corresponding result to each of IFFT unit 471-1 through IFFT unit 471-d$_c$. Each of IFFT unit 471-1 through IFFT unit 471-d$_c$ inputs therein a signal output from the check node processor 440, performs IFFT for the input signal, and outputs the inverse fast Fourier transformed signal to each of the multiplier 473-1, the multiplier 473-2, the multiplier 473-3, ... and the multiplier 473-d$_c$. Here, the IFFT performed in each of IFFT unit 471-1 through IFFT unit 471-d$_c$ means not ordinary IFFT, but IFFT performed on GF($2^p$). Further, each of IFFT unit 471-1 through IFFT unit 471-d$_c$ has the same structure as that of each of FFT unit 413-1 through FFT unit 413-d$_c$, except that an output thereof is scaled by $\frac{1}{2^p}$.

Each of multiplier 473-1 through multiplier 473-d$_c$ inputs therein a signal output from each of IFFT unit 471-1 through IFFT unit 471-d$_c$, and performs multiplication of the input signal and the multiplicative inverse element $$h_{ji_1}^{-1}, h_{ji_2}^{-1}, \cdots, h_{ji_{d_c}}^{-1}$$

of each edge value $$h_{ji_1}, h_{ji_2}, \cdots, h_{ji_{d_c}}$$

of the parity check matrix on GF($2^p$). Here, each of multiplier 473-1 through multiplier 473-d$_c$ also actually performs the permutation of the signal output from each of IFFT unit 471-1 through IFFT unit 471-d$_c$, and this permutation corresponds to the inverse of the permutation performed in each of multiplier 411-1 through multiplier 411-d$_c$. Hereinafter, for the convenience of explanation, the permutation performed in each of multiplier 473-1 through multiplier 473-d$_c$ will be referred to as "inverse permutation". Thus, a $2^p \times 2^p$ number of unit memories are required for storing the inverse permutation information. Further, since each unit memory consists of p bits, a memory capacity capable of storing total $2^p \times 2^p \times p$ bits is consequently required for storing the inverse permutation information. Since it is possible to extract one of the permutation information and the inverse permutation information from the other, it does not matter if only one of them is stored.

As stated above, in order to perform a check node operation, a memory capacity capable of storing $2^p \times 2^p \times p$ bits is required for storing permutation information or inverse permutation information. Therefore, there is a strong need for decoder which makes it possible to reduce the memory capacity required for the check node operation.

SUMMARY OF THE INVENTION

Accordingly, the present invention has been made to solve at least the above-mentioned problems occurring in conventional systems, and an aspect of the present invention is to provide an apparatus and a method for receiving a signal in a communication system using a non-binary LDPC code.

A further aspect of the present invention is to provide an apparatus and a method for receiving a signal in a communication system using a non-binary LDPC code, which decodes the non-binary LDPC code while minimizing the memory capacity required for performing a check node operation.

In order to accomplish these aspects, in accordance with one aspect of the present invention, there is provided an apparatus for receiving a signal in a communication system, the apparatus includes a receiver for receiving the signal and a decoder for decoding the received signal in a non-binary Low Density Parity Check (LDPC) decoding scheme in which elements of a Galois field are expressed by an exponent representation.

In accordance with another aspect of the present invention, there is provided a method for receiving a signal in a communication system, the method includes receiving a signal and decoding the received signal in a non-binary Low Density Parity Check (LDPC) decoding scheme in which elements of a Galois field are expressed by an exponent representation.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of the present invention will be described with reference to the accompanying drawings. It should be noted that similar components are designated by similar reference numerals although they are illustrated in different drawings. Also, in the following description, a detailed description of known functions and configurations incorporated herein will be omitted when it may obscure the subject matter of the present invention. Further, it should be noted that only parts essential for understanding the operations according to the present invention will be described and a description of parts other than the essential parts will be omitted in order not to obscure the gist of the present invention.

The present invention provides an apparatus and a method for receiving a signal in a communication system using a non-binary Low Density Parity Check (LDPC) code, which decodes the non-binary LDPC code while minimizing the memory capacity required for performing a check node operation. The present invention further provides an apparatus and a method for receiving a signal in a communication system, which decodes a non-binary LDPC code while minimizing the memory capacity required for performing a check node operation by using an exponent representation as a scheme for expressing elements of a Galois field GF(q). "q" in GF(q) indicates the order of GF, and $q=2^p$.

As mentioned above, a polynomial representation is used as a scheme for expressing elements of $GF(2^p)$ in a conventional communication system using a non-binary LPDC code. In this case, a memory capacity of $2^p \times 2^p \times p$ bits is required for performing a check node operation when the non-binary LDPC code is decoded. Thus, in the present invention, elements of $GF(2^p)$ are expressed using not the polynomial representation, but an exponent representation in order to reduce the memory capacity required for the check node operation to below a memory capacity of $2^p \times 2^p \times p$ bits. Reference will now be made to a scheme for expressing elements of $GF(2^p)$ by using the exponent representation proposed in the present invention.

First, all elements of $GF(2^p)$ are $\{0, 1, \alpha, \alpha^2, \ldots, \alpha^{q-2}\}$. In order to express all the elements of $GF(2^p)$ by using only their exponents, if we take the base-$\alpha$ logarithm ($\log_\alpha$) of each element of $GF(2^p)$, $\{-\infty, 0, 1, 2, \ldots, q-2\}$ can be obtained. The exponent representation is a representation scheme in which all the elements of $GF(2^p)$ are expressed by $\{-\infty, 0, 1, 2, \ldots, q-2\}$ obtained in this way. The exponent representation of $GF(2^p)$ will now be described by exemplifying $GF(2^4)$. Here, $GF(2^4)$ is generated from a fourth-order irreducible polynomial $p(x)=x^4+x+1$. Further, if it is assumed that a root of the fourth-order irreducible polynomial $p(x)=x^4+x+1$ is $\alpha$, all elements of $GF(2^4)$ are equal to $\{0, 1, \alpha, \alpha^2, \alpha^3, \ldots, \alpha^{14}\}$. Further, all the elements of $GF(2^4)$ can be expressed by at most a third-order polynomial $\alpha_3 x^3 + \alpha_2 x^2 + \alpha_1 x + \alpha_0$, the coefficients of which are defined in GF(2). If we take the base-$\alpha$ logarithm ($\log_\alpha$) of each element $\{0, 1, \alpha, \alpha^2, \alpha^3, \ldots, \alpha^{14}\}$ of $GF(2^4)$, $\{-\infty, 0, 1, 2, \ldots, 14\}$ can be obtained. Here, if it is assumed that "$-\infty$" is represented as "15", all the elements $\{0, 1, \alpha, \alpha^2, \alpha^3, \ldots, \alpha^{14}\}$ of $GF(2^4)$, the polynomial coefficients $\{\alpha_3, \alpha_2, \alpha_1, \alpha_0\}$, and decimal expressions corresponding thereto are shown below in Table 2.

TABLE 2

| element | $a_3$ | $a_2$ | $a_1$ | $a_0$ | decimal number |
|---------|-------|-------|-------|-------|----------------|
| 0 | 1 | 1 | 1 | 1 | $-\infty \to 15$ |
| 1 | 0 | 0 | 0 | 0 | 0 |
| $\alpha$ | 0 | 0 | 0 | 1 | 1 |
| $\alpha^2$ | 0 | 0 | 1 | 0 | 2 |
| $\alpha^3$ | 0 | 0 | 1 | 1 | 3 |
| $\alpha^4$ | 0 | 1 | 0 | 0 | 4 |
| $\alpha^5$ | 0 | 1 | 0 | 1 | 5 |
| $\alpha^6$ | 0 | 1 | 1 | 0 | 6 |
| $\alpha^7$ | 0 | 1 | 1 | 1 | 7 |
| $\alpha^8$ | 1 | 0 | 0 | 0 | 8 |
| $\alpha^9$ | 1 | 0 | 0 | 1 | 9 |
| $\alpha^{10}$ | 1 | 0 | 1 | 0 | 10 |
| $\alpha^{11}$ | 1 | 0 | 1 | 1 | 11 |
| $\alpha^{12}$ | 1 | 1 | 0 | 0 | 12 |
| $\alpha^{13}$ | 1 | 1 | 0 | 1 | 13 |
| $\alpha^{14}$ | 1 | 1 | 1 | 0 | 14 |

In Table 2, $\{\alpha_3, \alpha_2, \alpha_1, \alpha_0\}$ are values obtained by converting the integer values of the exponent representation into binary values.

As shown in Table 2, when elements of $GF(2^p)$ are expressed by the exponent representation, a multiplicative operation between two GF elements is transformed into a simple additive operation between integers, which can be expressed by Equation (3):

$$\alpha^i \otimes \alpha^j = \alpha^{i+j} \to i \otimes j = i+j \bmod(q-1) \quad (3)$$

In Equation (3), "$\otimes$" denotes a multiplicative operation on GF(q), and "mod" denotes a modulo operation.

In this way, when elements of GF(q) are expressed by the exponent representation, the memory capacity required for a check node operation is minimized in decoding a non-binary LDPC code by using an iterative decoding algorithm based on a sum-product algorithm, as described above in FIG. 3. hereinafter, this will be described in detail with reference to FIG. 5.

Figure 5:
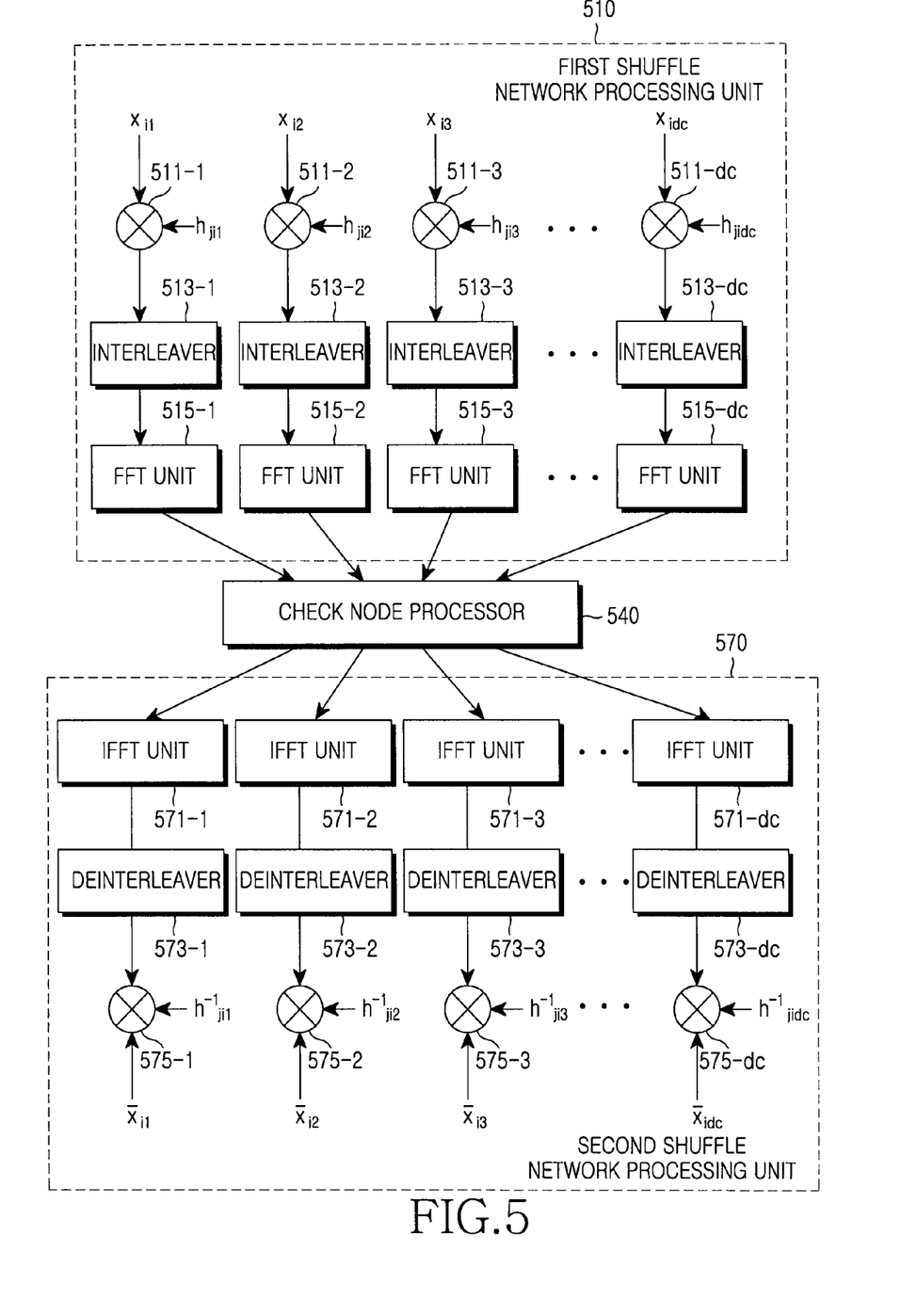
FIG. 5 is a block diagram illustrating the inner structure of a decoder for decoding a non-binary LDPC code in accordance with the present invention.

FIG. 5 is a block diagram illustrating the inner structure of a decoder for decoding a non-binary LDPC code according to the present invention. Before explaining FIG. 5, it should be appreciated that although the decoder generally includes a check node processing unit and a variable node processing unit, only the structure of the check node processing unit of the decode is illustrated in FIG. 5. Referring to FIG. 5, a node processing unit within the decoder includes a first shuffle network processing unit 510, a check node processor 540 and a second shuffle network processing unit 570.

The first shuffle network processing unit 510 includes a plurality of multipliers, for example, a $d_c$ number of multipliers, that is, a multiplier 511-1, a multiplier 511-2, a multiplier 511-3, . . . and a multiplier 511-d$_c$, a plurality of interleavers, for example, a $d_c$ number of interleavers, that is, an interleaver 513-1, an interleaver 513-2, an interleaver 513-3, . . . and an interleaver 513-d$_c$, and a plurality of FFT (Fast Fourier Transform) units, for example, a $d_c$ number of FFT units, that is, an FFT unit 515-1, an FFT unit 515-2, an FFT unit 515-3, ... and an FFT unit 515-$d_c$.

The second shuffle network processing unit 570 includes a plurality of IFFT (Inverse Fast Fourier Transform) units, for example, a $d_c$ number of IFFT units, that is, an IFFT unit 571-1, an IFFT unit 571-2, an IFFT unit 571-3, ... and an IFFT unit 571-$d_c$, a plurality of deinterleavers, for example, a $d_c$ number of deinterleavers, that is, a deinterleaver 573-1, a deinterleaver 573-2, a deinterleaver 573-3, ... and a deinterleaver 573-$d_c$, and a plurality of multipliers, for example, a $d_c$ number of multipliers, that is, a multiplier 575-1, a multiplier 575-2, a multiplier 575-3, ... and a multiplier 575-$d_c$.

The operation of the check node processing unit will now be described by exemplifying a jth check node in the parity check matrix of a non-binary LDPC code. Here, the degree of the jth check node is assumed to be $d_c$.

First, if it is assumed that input messages input into the first shuffle network processing unit 510 are $$x_{i_1}, x_{i_2}, \ldots, x_{i_{d_c}},$$

the input messages $$x_{i_1}, x_{i_2}, \ldots, x_{i_{d_c}}$$

are messages passed from a variable node to a check node, and each input message $$x_{i_1}, x_{i_2}, \ldots, x_{i_{d_c}}$$

is a vector with a size of $2^p$. The input messages $$x_{i_1}, x_{i_2}, \ldots, x_{i_{d_c}}$$

are input into the multiplier 511-1, the multiplier 511-2, the multiplier 511-3, ... and the multiplier 511-$d_c$, respectively.

Each of multiplier 511-1 through multiplier 511-$d_c$ performs multiplication of each input message vector $$x_{i_1}, x_{i_2}, \ldots, x_{i_{d_c}}$$

and each edge value $$h_{ji_1}, h_{ji_2}, \ldots, h_{ji_{d_c}}$$

of the parity check matrix on $GF(2^p)$. Here, the edge value $h_{ji}$ represents an element of $GF(2^p)$, which has an edge connecting variable node i and check node j, and the mention that the edge connecting the variable node i and the check node j has a value of $h_{ji}$ implies that an element existing in an jth row and an ith column of a parity check matrix defined in $GF(2^p)$ is $h_{ji}$. However, since the input messages are not elements on $GF(2^p)$, but indicate the probabilities of having the elements on $GF(2^p)$, each of the multiplier 511-1, the multiplier 511-2, the multiplier 511-3, ... and the multiplier 511-$d_c$ actually performs the permutation of each input message $$x_{i_1}, x_{i_2}, \ldots, x_{i_{d_c}}.$$

Here, since, in the case of using the exponent representation, multiplication for elements on $GF(2^p)$ is implemented as mod(q−1) addition, as shown in Equation (3), the permutation is implemented by (q−1)-sized shift registers for elements on $GF(2^p)$.

After the permutation, each of multiplier 511-1 through multiplier 511-$d_c$ outputs each permuted input message $$x_{i_1}, x_{i_2}, \ldots, x_{i_{d_c}}$$

to each of interleaver 513-1 through interleaver 513-$d_c$. Each of interleaver 513-1 through interleaver 513-$d_c$ inputs therein a signal output from each of multiplier 511-1 through multiplier 511-$d_c$, interleaves the input signal in a predetermined interleaving scheme, and then outputs the interleaved signal to each of FFT unit 515-1 through FFT unit 515-$d_c$. Here, since FFT performed in each of FFT unit 515-1 through FFT unit 515-$d_c$ is based on the assumption that elements of $GF(2^p)$ are expressed by the polynomial representation, each of interleaver 513-1 through interleaver 513-$d_c$ performs the interleaving operation in order to express the elements of $GF(2^p)$, which have been expressed by the exponent representation, again by the polynomial representation. Table 3 as presented below shows decimal numbers expressed by the polynomial representation (as shown in Table 1) and the exponent representation (as shown in Table 3), respectively.

TABLE 3

| element | polynomial representation | exponent representation |
|---|---|---|
| 0 | 0 | 15 |
| 1 | 1 | 0 |
| $\alpha$ | 2 | 1 |
| $\alpha^2$ | 4 | 2 |
| $\alpha^3$ | 8 | 3 |
| $\alpha^4$ | 3 | 4 |
| $\alpha^5$ | 6 | 5 |
| $\alpha^6$ | 12 | 6 |
| $\alpha^7$ | 11 | 7 |
| $\alpha^8$ | 5 | 8 |
| $\alpha^9$ | 10 | 9 |
| $\alpha^{10}$ | 7 | 10 |
| $\alpha^{11}$ | 14 | 11 |
| $\alpha^{12}$ | 15 | 12 |
| $\alpha^{13}$ | 13 | 13 |
| $\alpha^{14}$ | 9 | 14 |

As shown in Table 3, in the case of $GF(2^4)$, 16 unit memories are required for storing information on interleaving performed by the interleavers. Further, since each unit memory consists of 4 bits, a memory capacity of total 16×4 bits is consequently required for storing the interleaving information. Thus, in the case of $GF(2^p)$, a $2^p$ number of unit memories, each consisting of 4 bits, are required for storing information on interleaving performed by the interleavers, and consequently a memory capacity of total $2^p \times p$ bits is required for storing the interleaving information.

As a result of this, storing permutation information, for which a memory capacity of $2^p \times 2^p \times p$ bits is required in a conventional check node processing unit, is implemented by the (q−1)-sized shift registers and the interleavers requiring a memory capacity of $2^p \times p$ bits in the node processing unit according to the present invention, so that the required memory capacity can be reduced.

Further, each of the FFT unit 515-1, the FFT unit 515-2, the FFT unit 515-3, . . . and the FFT unit 515-$d_c$ inputs therein a signal output from each of the interleaver 513-1, the interleaver 513-2, the interleaver 513-3, . . . and the interleaver 513-$d_c$, performs FFT for the input signal, and then outputs the fast Fourier transformed signal to the check node processor 540. Here, the signal input into each of the FFT unit 515-1, the FFT unit 515-2, the FFT unit 515-3, . . . and the FFT unit 515-$d_c$ is the probability of elements expressed by the exponent representation as defined above in Table 2. Further, the FFT performed in each of the FFT unit 515-1, the FFT unit 515-2, the FFT unit 515-3, . . . and the FFT unit 515-$d_c$ means not ordinary FFT, but FFT performed on GF($2^p$), which is identical to FHT.

The check node processor 540 inputs therein a signal output from each of the FFT unit 515-1, the FFT unit 515-2, the FFT unit 515-3, . . . and the FFT unit 515-$d_c$, performs a check node operation, and then outputs a corresponding result to each of the IFFT unit 571-1, the IFFT unit 571-2, the IFFT unit 571-3, . . . and the IFFT unit 571-$d_c$. Each of the IFFT unit 571-1, the IFFT unit 571-2, the IFFT unit 571-3, . . . and the IFFT unit 571-$d_c$ inputs therein a signal output from the check node processor 540, performs IFFT for the input signal, and outputs the inverse fast Fourier transformed signal to each of the deinterleaver 573-1, the deinterleaver 573-2, the deinterleaver 573-3, . . . and the deinterleaver 573-$d_c$. Here, the IFFT performed in each of the IFFT unit 571-1, the IFFT unit 571-2, the IFFT unit 571-3, . . . and the IFFT unit 571-$d_c$ means not ordinary IFFT, but IFFT performed on GF($2^p$). Further, each of the IFFT unit 571-1, the IFFT unit 571-2, the IFFT unit 571-3, . . . and the IFFT unit 571-$d_c$ has the same structure as that of each of the FFT unit 515-1, the FFT unit 515-2, the FFT unit 515-3, . . . and the FFT unit 515-$d_c$, except that an output thereof is scaled by $1/2^p$.

Each of the deinterleaver 573-1, the deinterleaver 573-2, the deinterleaver 573-3, . . . and the deinterleaver 573-$d_c$ inputs therein a signal output from each of the IFFT unit 571-1, the IFFT unit 571-2, the IFFT unit 571-3, and the IFFT unit 571-$d_c$, deinterleaves the input signal in a predetermined deinterleaving scheme, and then output the deinterleaved signal to each of the multiplier 575-1, the multiplier 575-2, the multiplier 575-3, . . . and the multiplier 575-$d_c$. Here, the deinterleaving scheme used in each of the deinterleaver 573-1, the deinterleaver 573-2, the deinterleaver 573-3, . . . and the deinterleaver 573-$d_c$ is a deinterleaving scheme corresponding to the interleaving scheme used in each of the interleaver 513-1, the interleaver 513-2, the interleaver 513-3, . . . and the interleaver 513-$d_c$. That is, since the signal output from each of the IFFT unit 571-1, the IFFT unit 571-2, the IFFT unit 571-3, and the IFFT unit 571-$d_c$ is expressed by the polynomial representation, each of the deinterleaver 573-1, the deinterleaver 573-2, the deinterleaver 573-3, . . . and the deinterleaver 573-$d_c$ performs the deinterleaving operation in order to express the signal again by the exponent representation.

Each of the multiplier 575-1, the multiplier 575-2, the multiplier 575-3, . . . and the multiplier 575-$d_c$ inputs therein a signal output from each of the deinterleaver 573-1, the deinterleaver 573-2, the deinterleaver 573-3, . . . and the deinterleaver 573-$d_c$, and performs multiplication of the input signal and the multiplicative inverse element $$h_{ji_1}^{-1}, h_{ji_2}^{-1}, \ldots, h_{ji_{d_c}}^{-1}$$

of each edge value $$h_{ji_1}, h_{ji_2}, \cdots, h_{ji_{d_c}}$$

of the parity check matrix on GF($2^p$). Here, each of the multiplier 575-1, the multiplier 575-2, the multiplier 575-3, . . . and the multiplier 575-$d_c$ also actually performs the permutation of the signal output from each of the deinterleaver 573-1, the deinterleaver 573-2, the deinterleaver 573-3, . . . and the deinterleaver 573-$d_c$, and this permutation corresponds to the inverse of the permutation performed in each of the multiplier 511-1, the multiplier 511-2, the multiplier 511-3, . . . and the multiplier 511-$d_c$. Hereinafter, for the convenience of explanation, the permutation performed in each of the multiplier 575-1, the multiplier 575-2, the multiplier 575-3, . . . and the multiplier 575-$d_c$ will be referred to as "inverse permutation". Thus, the inverse permutation is also implemented by (q−1)-sized shift registers for elements on GF($2^p$). Since it is possible to extract one of the permutation information and the inverse permutation information from the other, it does not matter if only one of them is stored.

In the present invention, since storing permutation information, for which a memory capacity of $2^p \times 2^p \times p$ bits is conventionally required, is implemented by the (q−1)-sized shift registers and the interleavers requiring a memory capacity of $2^p \times p$ bits, and storing inverse permutation information, for which a memory capacity of $2^p 33 \, 2^p \times p$ bits is conventionally required, is implemented by the (q−1)-sized shift registers and the deinterleavers requiring a memory capacity of $2^p \times p$ bits, as described above, the memory capacity required for performing a check node operation can be minimized.

According to the present invention as described above, by expressing elements of GF(q) by an exponent representation in a communication system using a non-binary LDPC code, the memory capacity required for performing a check node operation in a decoder for decoding the non-binary LDPC code can be minimized.

While the invention has been shown and described with reference to certain preferred embodiments thereof, it will be understood by those skilled in the art that various changes in form and details may be made therein without departing from the spirit and scope of the invention, as defined by the appended claims.

What is claimed is:

1. A method for receiving a signal in a signal reception apparatus of a communication system, the method comprising:
   receiving a signal; and
   decoding the received signal in a non-binary Low Density Parity Check (LDPC) decoding scheme in which elements of a Galois field are expressed by an exponent representation.

2. The method as claimed in claim 1, wherein the non-binary LDPC decoding scheme includes a check node operation in which the elements of the Galois field are expressed by the exponent representation.

3. The method as claimed in claim 1, wherein decoding the received signal in the non-binary LDPC decoding scheme comprises:

expressing a plurality of messages input into any check node by the exponent representation and permuting the messages into permuted signals;
expressing the permuted signals by a polynomial representation and interleaving the signals;
fast Fourier transforming the interleaved signals on the Galois field;
performing a check node operation of the fast Fourier transformed signals;
inversely fast Fourier transforming the signals subjected to the check node operation;
expressing the inversely fast Fourier transformed signals by the exponent representation and deinterleaving the signals; and
inversely permuting the deinterleaved signals in a scheme corresponding to the permuting the messages.

4. The method as claimed in claim 3, wherein the exponent representation corresponds to a scheme in which only exponents of all elements of a Galois field $GF(2^p)$ are detected and all the elements of the Galois field $GF(2^p)$ are expressed using only the detected exponents.

5. The method as claimed in claim 4, wherein the Galois field $GF(2^p)$ is a Galois field $GF(2^4)$, and when all elements of the Galois field $GF(2^4)$ are expressed by at most a third-order polynomial $\alpha_3 x^3 + \alpha_2 x^2 + \alpha_1 x + \alpha_0$, coefficients defined in $GF(2)$, all the elements $\{0, 1, \alpha, \alpha^2, \alpha^3, \ldots, \alpha^{14}\}$ of the Galois field $GF(2^4)$, the polynomial coefficients $\{\alpha_3, \alpha_2, \alpha_1, \alpha_0\}$ and decimal expressions corresponding thereto are represented as follows:

| element | $a_3$ | $a_2$ | $a_1$ | $a_0$ | decimal number |
|---|---|---|---|---|---|
| 0 | 1 | 1 | 1 | 1 | $-\infty \to 15$ |
| 1 | 0 | 0 | 0 | 0 | 0 |
| $\alpha$ | 0 | 0 | 0 | 1 | 1 |
| $\alpha^2$ | 0 | 0 | 1 | 0 | 2 |
| $\alpha^3$ | 0 | 0 | 1 | 1 | 3 |
| $\alpha^4$ | 0 | 1 | 0 | 0 | 4 |
| $\alpha^5$ | 0 | 1 | 0 | 1 | 5 |
| $\alpha^6$ | 0 | 1 | 1 | 0 | 6 |
| $\alpha^7$ | 0 | 1 | 1 | 1 | 7 |
| $\alpha^8$ | 1 | 0 | 0 | 0 | 8 |
| $\alpha^9$ | 1 | 0 | 0 | 1 | 9 |
| $\alpha^{10}$ | 1 | 0 | 1 | 0 | 10 |
| $\alpha^{11}$ | 1 | 0 | 1 | 1 | 11 |
| $\alpha^{12}$ | 1 | 1 | 0 | 0 | 12 |
| $\alpha^{13}$ | 1 | 1 | 0 | 1 | 13 |
| $\alpha^{14}$ | 1 | 1 | 1 | 0 | 14. |

6. The method as claimed in claim 5, wherein expressing the permuted signals by the polynomial representation and interleaving the signals comprises expressing the permuted signals by the polynomial representation as shown in following table and interleaving the signals:

| element | polynomial representation | exponent representation |
|---|---|---|
| 0 | 0 | 15 |
| 1 | 1 | 0 |
| $\alpha$ | 2 | 1 |
| $\alpha^2$ | 4 | 2 |
| $\alpha^3$ | 8 | 3 |
| $\alpha^4$ | 3 | 4 |
| $\alpha^5$ | 6 | 5 |
| $\alpha^6$ | 12 | 6 |
| $\alpha^7$ | 11 | 7 |
| $\alpha^8$ | 5 | 8 |
| $\alpha^9$ | 10 | 9 |
| $\alpha^{10}$ | 7 | 10 |
| $\alpha^{11}$ | 14 | 11 |
| $\alpha^{12}$ | 15 | 12 |
| $\alpha^{13}$ | 13 | 13 |
| $\alpha^{14}$ | 9 | 14. |

7. An apparatus for receiving a signal in a communication system, the apparatus comprising:
a receiver for receiving the signal; and
a decoder for decoding the received signal in a non-binary Low Density Parity Check (LDPC) decoding scheme in which elements of a Galois field are expressed by an exponent representation.

8. The apparatus as claimed in claim 7, wherein the non-binary LDPC decoding scheme includes a check node operation in which the elements of the Galois field are expressed by the exponent representation.

9. The apparatus as claimed in claim 8, wherein the decoder comprises:
a plurality of multipliers for expressing a plurality of messages input into any check node by the exponent representation and permuting the messages into permuted signals;
a plurality of interleavers for expressing the permuted signals by a polynomial representation and interleaving the signals;
a plurality of Fast Fourier Transform units for fast Fourier transforming the interleaved signals on the Galois field;
a check node processor for performing a check node operation of the fast Fourier transformed signals;
a plurality of inverse FFT units for inversely fast Fourier transforming the signals subjected to the check node operation;
a plurality of deinterleavers for expressing the inversely fast Fourier transformed signals by the exponent representation and deinterleaving the signals; and
a plurality of multipliers for inversely permuting the deinterleaved signals in a scheme corresponding to the permuting the messages.

10. The apparatus as claimed in claim 9, wherein the exponent representation corresponds to a scheme in which only exponents of all elements of a Galois field $GF(2^p)$ are detected and all the elements of the Galois field $GF(2^p)$ are expressed using only the detected exponents.

11. The apparatus as claimed in claim 10, wherein the Galois field $GF(2^p)$ is a Golois field $GF(2^4)$, and when all the elements of the Galois field $GF(2^4)$ are expressed by at most a third-order polynomial $\alpha_3 x^3 + \alpha_2 x^2 + \alpha_1 x + \alpha_0$, coefficients of which are defined in $GF(2)$, all the elements $\{0, 1, \alpha, \alpha^2, \alpha^3, \ldots, \alpha^{14}\}$ of the Galois field $GF(2^4)$, the polynomial coefficients $\{\alpha_3, \alpha_2, \alpha_1, \alpha_0\}$ and decimal expressions corresponding thereto are presented as follows:

| element | $a_3$ | $a_2$ | $a_1$ | $a_0$ | decimal number |
|---|---|---|---|---|---|
| 0 | 1 | 1 | 1 | 1 | $-\infty \to 15$ |
| 1 | 0 | 0 | 0 | 0 | 0 |
| $\alpha$ | 0 | 0 | 0 | 1 | 1 |
| $\alpha^2$ | 0 | 0 | 1 | 0 | 2 |

-continued

| element | $a_3$ | $a_2$ | $a_1$ | $a_0$ | decimal number |
|---|---|---|---|---|---|
| $\alpha^3$ | 0 | 0 | 1 | 1 | 3 |
| $\alpha^4$ | 0 | 1 | 0 | 0 | 4 |
| $\alpha^5$ | 0 | 1 | 0 | 1 | 5 |
| $\alpha^6$ | 0 | 1 | 1 | 0 | 6 |
| $\alpha^7$ | 0 | 1 | 1 | 1 | 7 |
| $\alpha^8$ | 1 | 0 | 0 | 0 | 8 |
| $\alpha^9$ | 1 | 0 | 0 | 1 | 9 |
| $\alpha^{10}$ | 1 | 0 | 1 | 0 | 10 |
| $\alpha^{11}$ | 1 | 0 | 1 | 1 | 11 |
| $\alpha^{12}$ | 1 | 1 | 0 | 0 | 12 |
| $\alpha^{13}$ | 1 | 1 | 0 | 1 | 13 |
| $\alpha^{14}$ | 1 | 1 | 1 | 0 | 14. |

12. The apparatus as claimed in claim 11, wherein the plurality of interleavers express the permuted signals by the polynomial representation as shown in following table and interleave the signals:

| element | polynomial representation | exponent representation |
|---|---|---|
| 0 | 0 | 15 |
| 1 | 1 | 0 |
| $\alpha$ | 2 | 1 |
| $\alpha^2$ | 4 | 2 |
| $\alpha^3$ | 8 | 3 |
| $\alpha^4$ | 3 | 4 |
| $\alpha^5$ | 6 | 5 |
| $\alpha^6$ | 12 | 6 |
| $\alpha^7$ | 11 | 7 |
| $\alpha^8$ | 5 | 8 |
| $\alpha^9$ | 10 | 9 |
| $\alpha^{10}$ | 7 | 10 |
| $\alpha^{11}$ | 14 | 11 |
| $\alpha^{12}$ | 15 | 12 |
| $\alpha^{13}$ | 13 | 13 |
| $\alpha^{14}$ | 9 | 14. |

* * * * *